(12) United States Patent
Que

(10) Patent No.: US 8,940,551 B2
(45) Date of Patent: Jan. 27, 2015

(54) METHOD FOR MONITORING CONTACT HOLE ETCHING PROCESS OF TFT SUBSTRATE

(71) Applicant: Shenzhen China Star Optoelectronics Technology Co., Ltd., Shenzhen, Guangdong Province (CN)

(72) Inventor: Xiangdeng Que, Shenzhen (CN)

(73) Assignee: Shenzhen China Star Optoelectronics Technology Co., Ltd., Shenzhen, Guangdong Province (CN)

( * ) Notice: Subject to any disclaimer, the term of this patent is extended or adjusted under 35 U.S.C. 154(b) by 82 days.

(21) Appl. No.: 13/806,745

(22) PCT Filed: Oct. 24, 2012

(86) PCT No.: PCT/CN2012/083389
§ 371 (c)(1),
(2) Date: Dec. 21, 2012

(87) PCT Pub. No.: WO2014/056251
PCT Pub. Date: Apr. 17, 2014

(65) Prior Publication Data
US 2014/0099737 A1  Apr. 10, 2014

(30) Foreign Application Priority Data

Oct. 9, 2012 (CN) .......................... 2012 1 0381208

(51) Int. Cl.
*H01L 29/06* (2006.01)
*H01L 21/66* (2006.01)

(52) U.S. Cl.
CPC ............... *H01L 22/12* (2013.01); *H01L 22/26* (2013.01)

USPC ...................................... 438/7; 438/8; 438/16

(58) Field of Classification Search
USPC ................................... 438/5–9, 16
See application file for complete search history.

(56) References Cited

U.S. PATENT DOCUMENTS

| 6,958,248 | B1 * | 10/2005 | Le Roy et al. | 438/708 |
| 7,884,024 | B2 * | 2/2011 | Le Roy et al. | 438/708 |
| 2007/0284586 | A1 * | 12/2007 | Park et al. | 257/72 |

FOREIGN PATENT DOCUMENTS

| CN | 1195187 A | 10/1998 |
| CN | 101625992 A | 1/2010 |
| JP | 4-65154 A | 3/1992 |
| JP | 10-263857 A | 10/1998 |

\* cited by examiner

*Primary Examiner* — Julio J Maldonado
*Assistant Examiner* — Robert Bachner
(74) *Attorney, Agent, or Firm* — Cheng-Ju Chiang

(57) ABSTRACT

The present invention provides a method for monitoring a contact hole etching process of a TFT substrate, which includes: (1) providing a substrate having a first metal layer and a monitoring machine; (2) providing a target value of reflection rate of the substrate having the first metal layer; (3) applying a masking operation to patternize the first metal layer for forming a gate terminal; (4) forming a gate insulation layer on the gate terminal; and (5) forming a contact hole in the gate insulation layer through etching and simultaneously operating the monitoring machine to measure the reflection rate of a bottom of the contact hole, whereby when the reflection rate of the bottom of the contact hole is substantially equal to the target value, the etching operation is stopped. The variation of reflection rate of the metal layer is monitored to identify if the insulation layer is completely etched away.

11 Claims, 4 Drawing Sheets

METHOD FOR MONITORING CONTACT HOLE ETCHING PROCESS OF TFT SUBSTRATE

BACKGROUND OF THE INVENTION

1. Field of the Invention

The present invention relates to the field of manufacturing liquid crystal display devices, and in particular to a method for monitoring a contact hole etching process of a TFT substrate.

2. The Related Arts

Liquid crystal displays (LCDs) have numerous advantages, such as thin device body, less power consumption, and being free of radiation, and is thus widely used. Most of the flat panel display devices available in the market are backlighting liquid crystal displays, which comprise an enclosure, a liquid crystal panel arranged inside the enclosure, and a backlight module arranged inside the enclosure. The operation principle of the liquid crystal panel is that liquid crystal molecules are arranged between two parallel glass substrates and a plurality of fine vertical and horizontal wires is set between the two glass substrate, whereby electricity is selectively applied to cause change of the orientation of the liquid crystal molecules in order to refract out the light from a backlight module for formation of an image.

A liquid crystal display panel is generally composed of a color filter (CF) substrate, a thin-film transistor (TFT) substrate, liquid crystal (LC) interposed between the CF substrate and the TFT substrate, and a sealant. A general manufacturing process comprises a front stage of array process (including thin film, yellow light, etching, and film stripping), an intermediate stage of cell process (including bonding TFT substrate and the CF substrate), and a rear stage of assembling process (including mounting drive ICs and printed circuit board). The front stage of array process generally makes the TFT substrate for controlling the movement of liquid crystal molecules. The intermediate stage of cell process generally introduces liquid crystal between the TFT substrate and the CF substrate. The rear stage of assembling process generally mounts the drive ICs and combining the printed circuit board to effect driving the liquid crystal molecules to rotate for displaying images.

The TFT substrate generally comprises a glass substrate and TFTs formed on the glass substrate. To form the TFTs, insulation layers on a gate metal layer and source/drain metal layers must be removed through etching. However, since the insulation layers on the gate metal and the source and source/drain metal are of different thicknesses, end point detection is hard to implement in the etching machines in an etching process.

Furthermore, to effect electrical connection, a contact hole must be formed through etching an insulation layer in order to expose a source electrode. The formation of the contact hole is generally done in two ways. The first one is that formation is made by removing a drain insulation layer (PVX) and gate insulation layer with dry etching, where the source electrode of such a structure is generally made of Al/Mo; and the second one is that formation is made by removing a drain insulation layer (PVX) with dry etching, where the source electrode of such a structure is generally made of Mo/Al/Mo. Taking a TFT substrate of a 32-inch liquid crystal panel available from China Star Optoelectronics Technology (CSOT) of China as an example, a description of the thickness of each layer of the two structures will be given. For the first structure, the source electrode is made of Al/Mo, where the Al layer has a thickness of 3900 Å, the Mo layer has a thickness of 600 Å, a source/drain insulation layer (formed of $SiN_x$ layer) has a thickness of 2000 Å, and a gate insulation layer (formed of $SiN_x$ layer) has a thickness of 4000 Å; for the second structure, the Mo layer, the Al layer, and the Mo layer (from top down) of the source electrode respectively have thicknesses of 350 Å, 3000 Å, and 100 Å and the source/drain insulation layer (formed of $SiN_x$ layer) has a thickness of 2000 Å

A transparent conductive layer (ITO) is formed in the contact hole formed in the above process and etching is applied to form a via hole so as to achieve electrical connection between the source electrode and a pixel electrode. In the conventional etching process, a nano machine is used to inspect the thickness of a film to be etched and an etching depth is determined according to the thickness. However, the conventional nano machine has a limited range of inspection, whereby precise inspection cannot be made for a film having a thickness less than 300 Å. In etching a via hole, over etching will result in poor taping of ITO and easy wire breaking, and thus leading to abnormality of the thin-film transistor.

SUMMARY OF THE INVENTION

An object of the present invention is to provide a method for manufacturing a thin-film transistor active device, which detects variation of reflection rate of a metal layer to determine the extent of etching of a contact hole so as to effectively ensure the result of etching of the contact hole thereby improving the quality of a TFT substrate.

To achieve the object, the present invention provides a for monitoring contact hole etching process of TFT substrate, which comprises the following steps:

(1) providing a substrate having a first metal layer and a monitoring machine;

(2) providing a target value of reflection rate of the substrate having the first metal layer;

(3) applying a masking operation to patternize the first metal layer for forming a gate terminal;

(4) forming a gate insulation layer on the gate terminal; and (5) forming a contact hole in the gate insulation layer through etching and simultaneously operating the monitoring machine to measure the reflection rate of a bottom of the contact hole, whereby when the reflection rate of the bottom of the contact hole reaches a value between 90%-110% of the target value, the etching operation is stopped.

The substrate comprises a glass substrate or a plastic substrate.

The first metal layer comprises an aluminum layer.

In step (2), the target value of reflection rate is reflection rate of the aluminum layer of the first metal layer.

The gate insulation layer comprises a silicon nitride layer.

The present invention also provides a method for monitoring a contact hole etching process of a TFT substrate, which comprises the following steps:

(1) providing a substrate having a second metal layer and a monitoring machine;

(2) providing a target value of reflection rate of the substrate having the second metal layer;

(3) applying a masking operation to patternize the second metal layer for forming a source/drain terminal;

(4) forming a source/drain insulation layer on the source/drain terminal; and (5) forming a contact hole in the source/drain insulation layer through etching and simultaneously operating the monitoring machine to measure the reflection rate of a bottom of the contact hole, whereby when the reflection rate of the bottom of the contact hole reaches a value between 90%-110% of the target value, the etching operation is stopped.

The substrate comprises a glass substrate or a plastic substrate.

The second metal layer comprises an aluminum layer.

In step (2), the target value of reflection rate is reflection rate of the aluminum layer of the second metal layer.

The source/drain insulation layer comprises a silicon nitride layer.

The present invention further provides a method for monitoring contact hole etching process of TFT substrate, which comprises the following steps:

(1) providing a substrate having a second metal layer and a monitoring machine;

(2) providing a target value of reflection rate of the substrate having the second metal layer;

(3) applying a masking operation to patternize the second metal layer for forming a source/drain terminal;

(4) forming a source/drain insulation layer on the source/drain terminal; and (5) forming a contact hole in the source/drain insulation layer through etching and simultaneously operating the monitoring machine to measure the reflection rate of a bottom of the contact hole, whereby when the reflection rate of the bottom of the contact hole reaches a value between 90%-110% of the target value, the etching operation is stopped; and wherein the substrate comprises a glass substrate or a plastic substrate;

wherein the second metal layer comprises an aluminum layer;

wherein in step (2), the target value of reflection rate is reflection rate of the aluminum layer of the second metal layer; and wherein the source/drain insulation layer comprises a silicon nitride layer.

The efficacy of the present invention is that the present invention provides a method for monitoring a contact hole etching process of a TFT substrate, which monitors the variation of reflection rate of a metal layer to identify if an insulation layer inside a contact hole is completely etched away so as to prevent the TFT substrate from being scraped due to contact resistance caused by incomplete etching of the insulation layer and also prevent over etching that causes undercutting of the contact hole, giving the contact hole a power configuration and making contact poor in coating ITO.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Referring to FIGS. 1-4, the present invention provides a method for monitoring a contact hole etching process of a TFT (Thin-Film Transistor) substrate, which comprises the following steps:

Step 1: providing a substrate 20 having a first metal layer 40 and a monitoring machine (not shown).

The substrate 20 is a transparent substrate and is preferably a glass substrate or a plastic substrate. The monitoring machine is a nano machine. Specification requirement for each test key used in the nano machine is a 2000 um×2000 um square.

The first metal layer is an aluminum/molybdenum (Al/Mo) layer.

Step 2: providing a target value of reflection rate of the substrate 20 having the first metal layer 40.

The reflection rate target value of this step is the reflection rate of the aluminum layer of the first metal layer, of which an inspection process is that a test key is defined on the aluminum layer of the first metal layer 40, where the specification of the test key is a 2000 um×2000 um square in order to comply with the requirement for test specification of the monitoring machine, whereby the monitoring machine is used to measure the reflection rate of the aluminum layer and record the reflection rate as a target value.

Step 3: applying a masking operation to patternize the first metal layer 40 for forming a gate terminal.

Step 4: forming a gate insulation layer 60 on the gate terminal.

The gate insulation layer 60 is a silicon nitride ($SiN_x$) layer.

Step 5: forming a contact hole 62 in the gate insulation layer 60 through etching and simultaneously operating the monitoring machine to measure the reflection rate of a bottom of the contact hole 62, whereby when the reflection rate of the bottom of the contact hole 62 reaches a value between 90%-110% of the target value, the etching operation is stopped.

Figure 1:
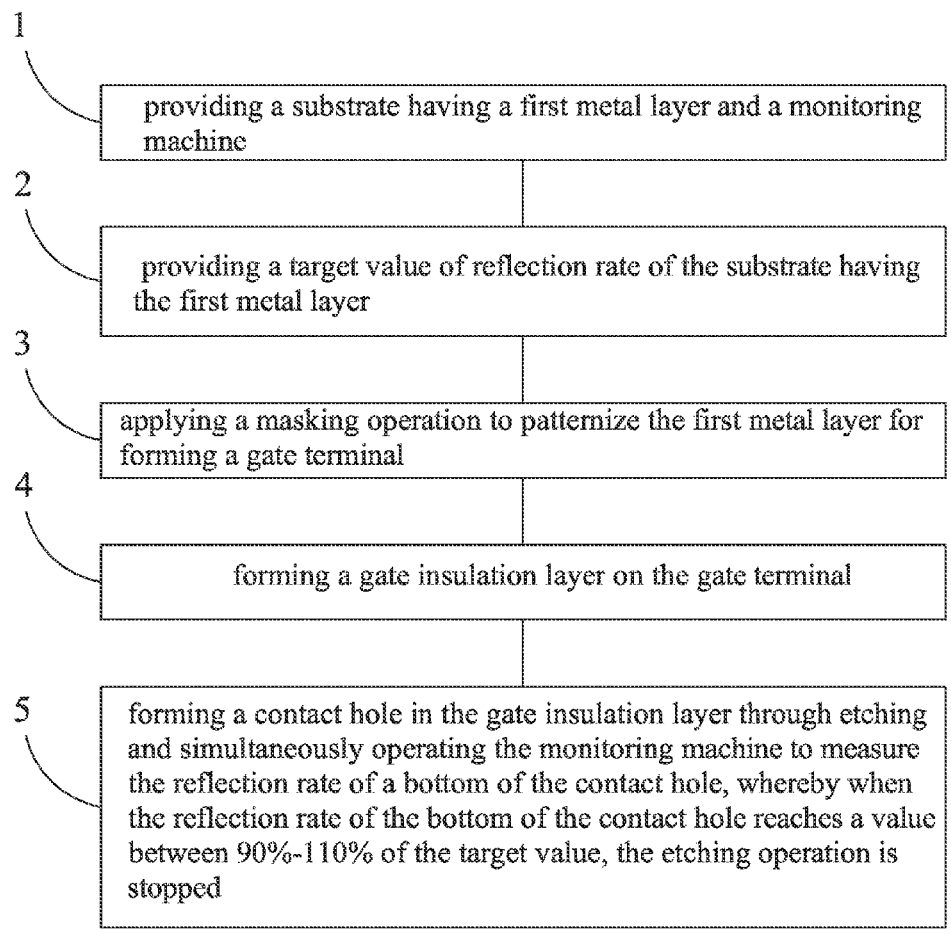
FIG. 1 is a flow chart illustrating a method for monitoring a contact hole etching process of a TFT substrate according to an embodiment of the present invention.
Figure 2:
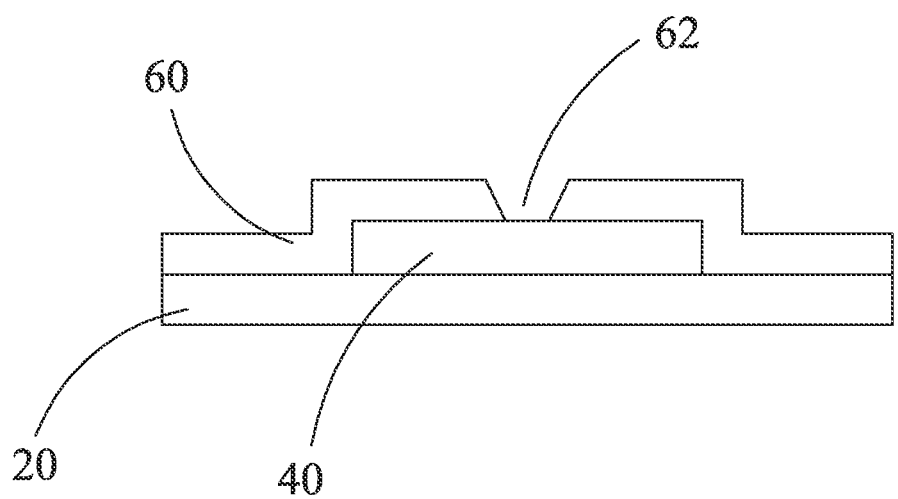
FIG. 2 is a schematic view showing a TFT substrate having a contact hole formed through etching of the method illustrated in FIG. 1.
Figure 3:
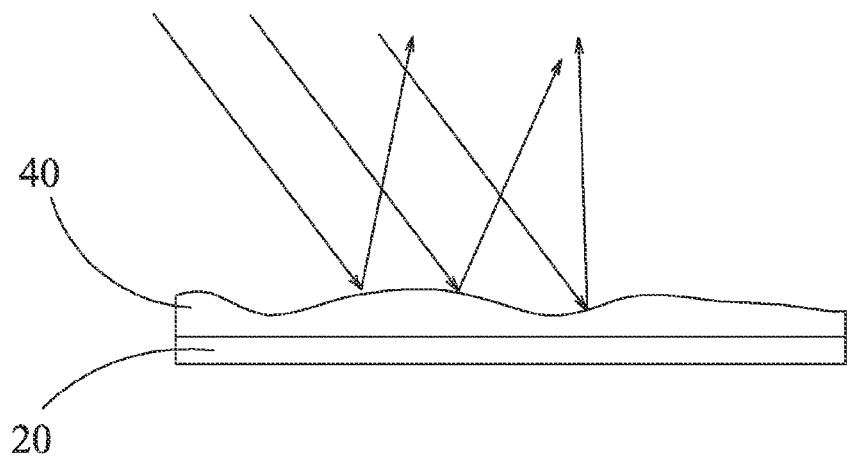
FIG. 3 is a schematic view showing paths of light reflected by a metal layer.

In the process of monitoring the reflection rate of the bottom of the contact hole 62, if the bottom of the contact hole 62 has no gate insulation layer 60 but only the first metal layer 40 (as shown in FIG. 3), since the first metal layer 40 has a surface that is relatively rough, scattered reflection may easily occur so that most of the laser emitting from the monitoring machine is scattered and the energy of the laser that is reflected back is relatively small, making the reflection rate detected by the monitoring machine relatively low. However, when the reflection rate detected by the monitoring machine is lower than 10% of the target value, it indicates over etching, which may result in undercutting of the contact hole 62, giving the contact hole 62 a poor configuration and thus making contact poor in a subsequent coating of ITO and affecting the quality of the TFT substrate.

Figure 4:
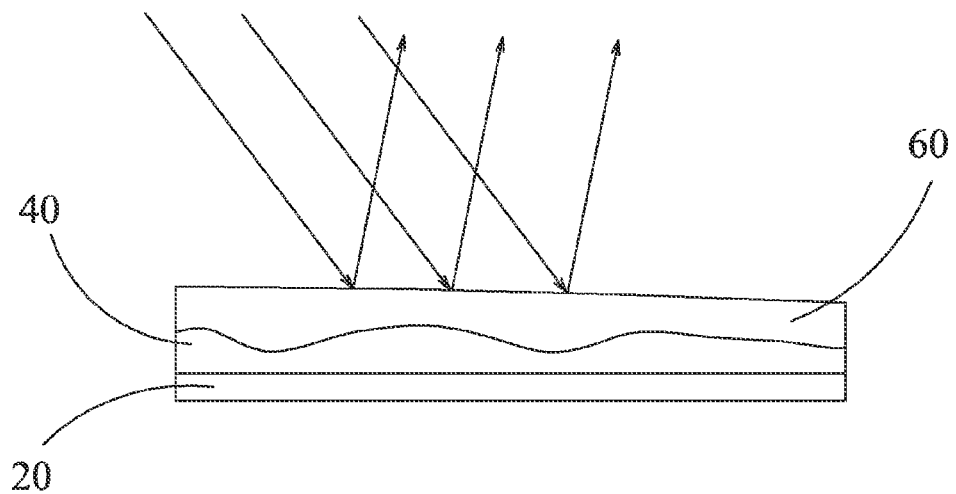
FIG. 4 is a schematic view showing paths of light reflected by an insulation layer.

On the contrary, if residue of the gate insulation layer 60 is left on the bottom of the contact hole 62 (as shown in FIG. 4), since the gate insulation layer 60 that is a silicon nitride layer is relatively smooth, the surface of the first metal layer 40 covered in this way is relatively smooth and mirror reflection may easily occur so that most of the laser emitting from the monitoring machine is reflected back and the reflection rate detected by the machine is relatively high. When the reflection rate detected by the monitoring machine is higher than 10% of the target value, it indicates that the gate insulation layer 60 is not completely etched away and this similarly makes contact poor in subsequent coating of ITO and affecting the quality of the TFT substrate.

It is noted that since the thickness (THK) of the gate insulation layer 60, the refraction rate (N) of the gate insulation layer 60, the square resistance (Rs) of the aluminum layer of the first metal layer 40, and the manufacturing process all affect the reflection rate of the bottom of the contact hole 62, before a monitoring machine is operated to detect the reflection rate of the bottom of the contact hole 62, the thickness (THK) of the gate insulation layer 60, the refraction rate (N) of the gate insulation layer 60, and the square resistance (Rs) of the aluminum layer of the first metal layer 40 must be first detected and recorded to serve as references in forming the contact hole 62 through etching in order to ensure the accuracy of etching.

Figure 5:
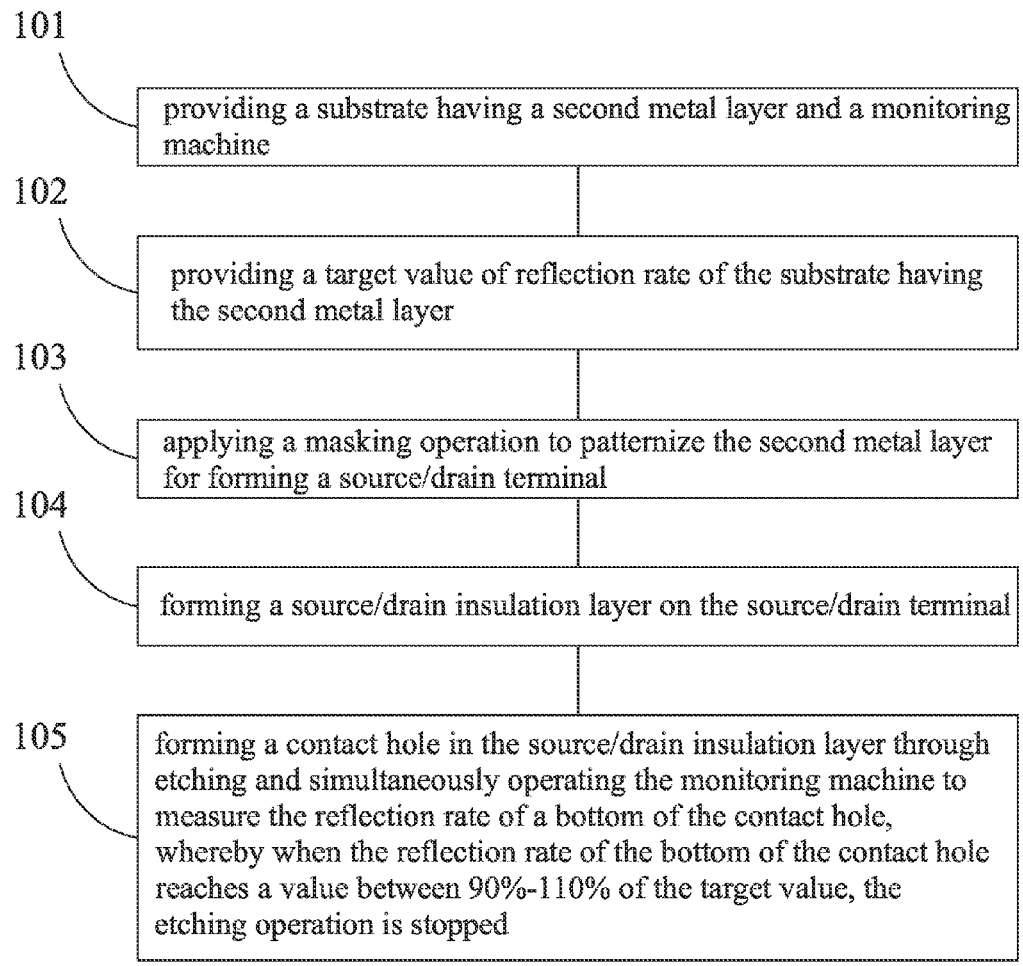
FIG. 5 is a flow chart illustrating a method for monitoring a contact hole etching process of a TFT substrate according to another embodiment of the present invention.

Referring to FIG. 5, the present invention also provides a method for monitoring a contact hole etching process of a TFT substrate, which comprises the following steps:

Step 101: providing a substrate having a second metal layer and a monitoring machine.

The substrate is a transparent substrate and is preferably a glass substrate or a plastic substrate. The monitoring machine is a nano machine. Specification requirement for each test key used in the nano machine is a 2000 um×2000 um square.

The second metal layer is an aluminum/molybdenum (Al/Mo) layer or a molybdenum/aluminum/molybdenum (Mo/Al/Mo) layer.

Step 102: providing a target value of reflection rate of the substrate having the second metal layer.

The reflection rate target value of this step is the reflection rate of the aluminum layer of the second metal layer, of which an inspection process is that after an aluminum layer is formed in the process of forming the second metal layer, a test key is defined on the aluminum layer, where the specification of the test key is a 2000 um×2000 um square in order to comply with the requirement for test specification of the monitoring machine, whereby the monitoring machine is used to measure the reflection rate of the aluminum layer and record the reflection rate as a target value.

Step 103: applying a masking operation to patternize the second metal layer for forming a source/drain terminal.

Step 104: forming a source/drain insulation layer on the source/drain terminal.

The source/drain insulation layer is a silicon nitride layer.

Step 105: forming a contact hole in the source/drain insulation layer through etching and simultaneously operating the monitoring machine to measure the reflection rate of a bottom of the contact hole, whereby when the reflection rate of the bottom of the contact hole reaches a value between 90%-110% of the target value, the etching operation is stopped.

In the process of monitoring the reflection rate of the bottom of the contact hole, if the bottom of the contact hole has no source/drain insulation layer but only the second metal layer, since the second metal layer has a surface that is relatively rough, scattered reflection may easily occur so that most of the laser emitting from the monitoring machine is scattered and the energy of the laser that is reflected back is relatively small, making the reflection rate detected by the monitoring machine relatively low. However, when the reflection rate detected by the monitoring machine is lower than 10% of the target value, it indicates over etching, which may result in undercutting of the contact hole, giving the contact hole a poor configuration and thus making contact poor in a subsequent coating of ITO and affecting the quality of the TFT substrate.

On the contrary, if residue of the source/drain insulation layer is left on the bottom of the contact hole, since the source/drain insulation layer that is a silicon nitride layer is relatively smooth, the surface of the second metal layer covered in this way is relatively smooth and mirror reflection may easily occur so that most of the laser emitting from the monitoring machine is reflected back and the reflection rate detected by the machine is relatively high. When the reflection rate detected by the monitoring machine is higher than 10% of the target value, it indicates that the source/drain insulation layer is not completely etched away and this similarly makes contact poor in subsequent coating of ITO and affecting the quality of the TFT substrate.

It is noted that since the thickness (THK) of the gate insulation layer 60, the refraction rate (N) of the gate insulation layer 60, the square resistance (Rs) of the aluminum layer of the first metal layer 40, and the manufacturing process all affect the reflection rate of the bottom of the contact hole 62, before a monitoring machine is operated to detect the reflection rate of the bottom of the contact hole 62, the thickness (THK) of the gate insulation layer 60, the refraction rate (N) of the gate insulation layer 60, and the square resistance (Rs) of the aluminum layer of the first metal layer 40 must be first detected and recorded to serve as references in forming the contact hole 62 through etching in order to ensure the accuracy of etching.

In summary, the present invention provides a method for monitoring a contact hole etching process of a TFT substrate, which monitors the variation of reflection rate of a metal layer to identify if an insulation layer inside a contact hole is completely etched away so as to prevent the TFT substrate from being scraped due to contact resistance caused by incomplete etching of the insulation layer and also prevent over etching that causes undercutting of the contact hole, giving the contact hole a power configuration and making contact poor in coating ITO.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for monitoring a contact hole etching process of a thin-film transistor (TFT) substrate, comprising the following steps:
   (1) providing a substrate having a first metal layer and a monitoring machine;
   (2) providing a target value of reflection rate of the substrate having the first metal layer by measuring a reflection rate of the first metal layer to serve as the target value;
   (3) applying a masking operation to patternize the first metal layer for forming a gate terminal;
   (4) forming a gate insulation layer on the gate terminal; and
   (5) forming a contact hole in the gate insulation layer through etching and simultaneously operating the monitoring machine to solely measure the reflection rate of a bottom of the contact hole, whereby when the reflection rate of the bottom of the contact hole reaches a value between 90%-110% of the target value, the etching operation is stopped.

2. The method for monitoring a contact hole etching process of a TFT substrate as claimed in claim 1, wherein the substrate comprises a glass substrate or a plastic substrate.

3. The method for monitoring a contact hole etching process of a TFT substrate as claimed in claim 1, wherein the first metal layer comprises an aluminum layer.

4. The method for monitoring a contact hole etching process of a TFT substrate as claimed in claim 3, wherein in step (2), the target value of reflection rate is reflection rate of the aluminum layer of the first metal layer.

5. The method for monitoring a contact hole etching process of a TFT substrate as claimed in claim 1, wherein the gate insulation layer comprises a silicon nitride layer.

6. A method for monitoring a contact hole etching process of a thin-film transistor (TFT) substrate, comprising the following steps:
   (1) providing a substrate having a second metal layer and a monitoring machine;
   (2) providing a target value of reflection rate of the substrate having the second metal layer by measuring a reflection rate of the second metal layer to serve as the target value;
   (3) applying a masking operation to patternize the second metal layer for forming a source/drain terminal;
   (4) forming a source/drain insulation layer on the source/drain terminal; and
   (5) forming a contact hole in the source/drain insulation layer through etching and simultaneously operating the monitoring machine to solely measure the reflection rate of a bottom of the contact hole, whereby when the reflection rate of the bottom of the contact hole reaches a value between 90%-110% of the target value, the etching operation is stopped.

7. The method for monitoring a contact hole etching process of a TFT substrate as claimed in claim 6, wherein the substrate comprises a glass substrate or a plastic substrate.

8. The method for monitoring a contact hole etching process of a TFT substrate as claimed in claim 6, wherein the second metal layer comprises an aluminum layer.

9. The method for monitoring a contact hole etching process of a TFT substrate as claimed in claim 8, wherein in step (2), the target value of reflection rate is reflection rate of the aluminum layer of the second metal layer.

10. The method for monitoring a contact hole etching process of a TFT substrate as claimed in claim 6, wherein the source/drain insulation layer comprises a silicon nitride layer.

11. A method for monitoring a contact hole etching process of a thin-film transistor (TFT) substrate, comprising the following steps:
   (1) providing a substrate having a second metal layer and a monitoring machine;
   (2) providing a target value of reflection rate of the substrate having the second metal layer by measuring a reflection rate of the second metal layer to serve as the target value;
   (3) applying a masking operation to patternize the second metal layer for forming a source/drain terminal;
   (4) forming a source/drain insulation layer on the source/drain terminal; and
   (5) forming a contact hole in the source/drain insulation layer through etching and simultaneously operating the monitoring machine to solely measure the reflection rate of a bottom of the contact hole, whereby when the reflection rate of the bottom of the contact hole reaches a value between 90%-110% of the target value, the etching operation is stopped;
   wherein the substrate comprises a glass substrate or a plastic substrate;
   wherein the second metal layer comprises an aluminum layer;
   wherein in step (2), the target value of reflection rate is reflection rate of the aluminum layer of the second metal layer; and
   wherein the source/drain insulation layer comprises a silicon nitride layer.

* * * * *